Figure 1:
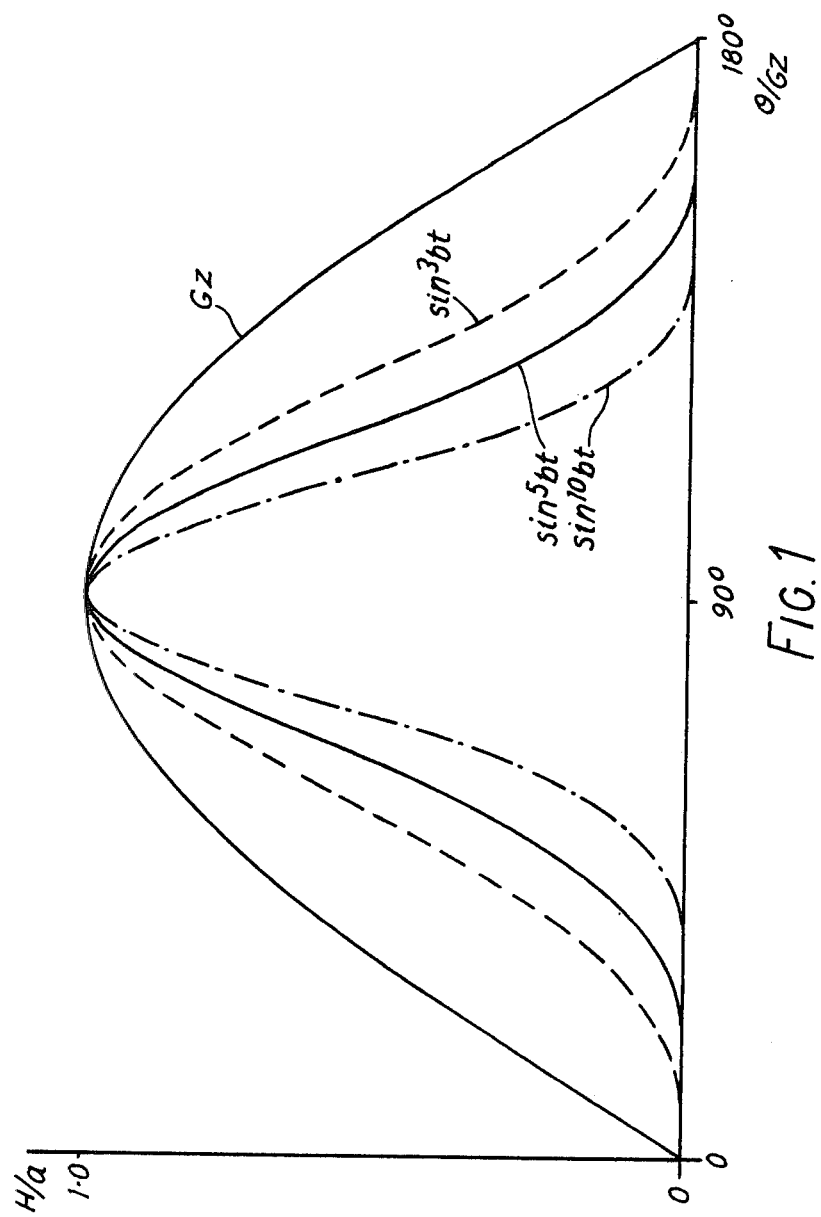

United States Patent [19]

Walters

[11] 4,307,344

[45] Dec. 22, 1981

[54] IMAGING SYSTEMS

[75] Inventor: Peter E. Walters, Southall, England

[73] Assignee: EMI Limited, Hayes, England

[21] Appl. No.: 111,256

[22] Filed: Jan. 11, 1980

[30] Foreign Application Priority Data

Jan. 25, 1979 [GB] United Kingdom ............... 02751/79

[51] Int. Cl.³ ............................................ G01N 27/00
[52] U.S. Cl. .................................... 324/307; 324/309
[58] Field of Search ............... 324/300, 307, 309, 310, 324/312

[56] References Cited

U.S. PATENT DOCUMENTS 4,021,726  5/1977  Garroway et al. .................. 324/309
4,045,723  8/1977  Ernst .................................... 324/309

OTHER PUBLICATIONS

R. Sutherland, "Three-Dimensional NMR Imaging Using Selective Excitation," J. Phys., E: Sci. Instrum, vol. 11, No. 1, 1978, pp. 79-83.

J. M. S. Hutchison, "NMR Imaging: Image Recovery Under Magnetic Fields with Large Non-Uniformities", J. Phys., E; Sci. vol. 11, 1978, pp. 217-221.

Primary Examiner—Michael J. Tokar
Attorney, Agent, or Firm—Fleit & Jacobson

[57] ABSTRACT

In a nuclear magnetic resonance imaging apparatus it has been proposed to excite resonance preferentially in a cross-sectional slice of a patient's body by applying a field gradient pulse in conjunction with a pulse of RF. It has been found that the shape of the RF pulse envelope can be chosen to reduce excitation outside the chosen slice. It is proposed that the RF envelope should be a unidirectional pulse of which both the rising and falling parts are monotonic curves lying between limits given by $\sin^3 t$ and $\sin^{10} t$ curves, preferably $\sin^5 t$. An acceptable curve may fall below $\sin^{10} t$ in the skirts but should not change sign.

15 Claims, 11 Drawing Figures

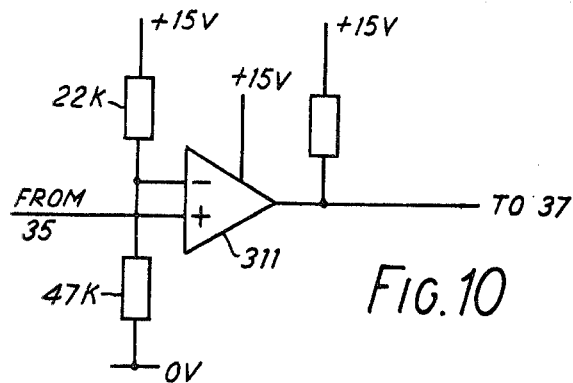
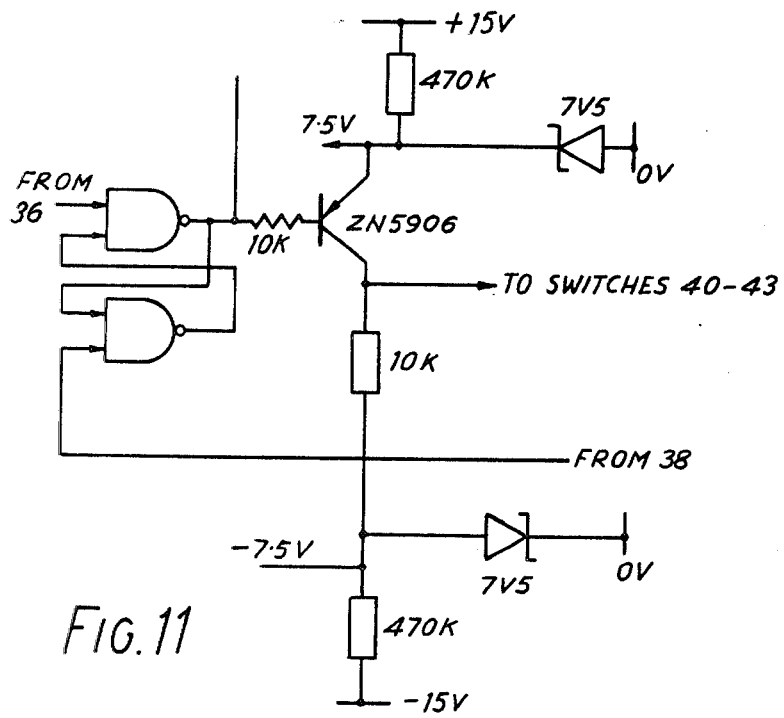

IMAGING SYSTEMS

The present invention relates to systems for providing images of distributions of a quantity, in a chosen region of a body by gyro-magnetic resonance, in particular, nuclear magnetic resonance (NMR) techniques. NMR techniques are suitable for examination of bodies of different kinds and, in particular, the medical examination of patients.

It has been proposed to use such nuclear magnetic resonance techniques for medical examination, to provide distributions of water content or relaxation time constants in sectional slices or volumes of patients. Such distributions are similar to, although of different significance from, the distributions of X-ray attenuation provided by computerised tomography systems.

Practical NMR systems, such as those described in our co-pending patent applications Ser. Nos. 041,424, 039,650, 040,289, 039,649 and 048,777 operate by applying suitable combinations of magnetic fields to the body being examined, via coil systems, and detecting induced currents in one or more detector coil systems. A suitable sequence of pulsed magnetic fields has been devised to achieve accurate and rapid examination. One consideration which is important in the application of such pulse sequences is that resonance should be provoked in the region to be examined and not in other parts of the body.

It is an object of this invention to provide an improvement in such systems by which resonance out of the examined region is reduced.

According to one aspect of the invention there is provided an apparatus for examining a body by means of nuclear magnetic resonance, the apparatus including: means for applying to the body a steady magnetic field along an axis therein; means for applying a pulsed gradient field which, in conjunction with the steady field, gives a predetermined field in a cross-sectional slice of the body; means for applying a pulsed periodic magnetic field at the Larmor frequency for the field in said slice to cause resonance preferentially therein, the pulse envelope of said periodic field having a rising part and a falling part each of which conforms to a monotonic curve lying substantially between limits defined on the one hand by the curve defined by amplitude$=a\sin^3 bt$ and on the other hand by the curve defined by amplitude$=a\sin^{10} bt$, where $b$ defined a duration substantially equal to the gradient field pulse; means for detecting the resonance signal resulting from said resonance; and means for analysing said signal.

According to another aspect of the invention there is provided a method of examining a body by nuclear magnetic resonance, the method including: applying to the body a magnetic field including a pulsed field gradient along an axis in the body to provide a predetermined field in a cross-sectional slice perpendicular to said axis; applying a pulsed periodic magnetic field at the Larmor frequency for said predetermined field to preferentially cause resonance in the slice; and sensing the resulting resonance signed for subsequent analysis; wherein the periodic field envelope is a single unidirectional pulse lying substantially inside the curve defined by amplitude$=a\sin^3 bt$, where $b$ defines a direction substantially that of the gradient pulse and $a$ is chosen to give a desired total field integral for the pulse.

Figure 2:
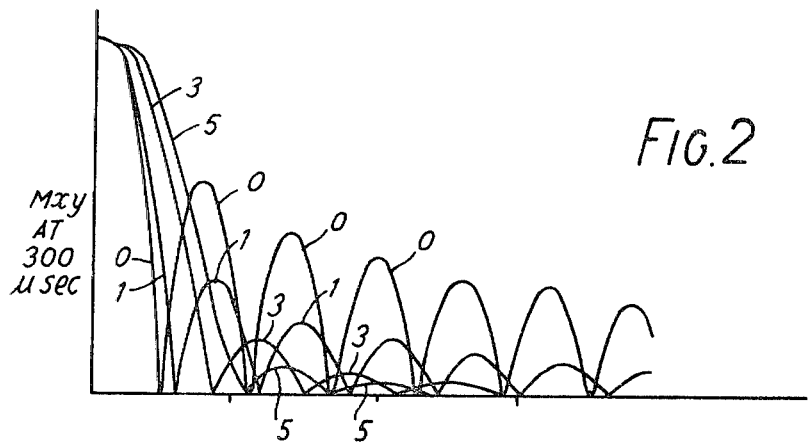
Figure 3:
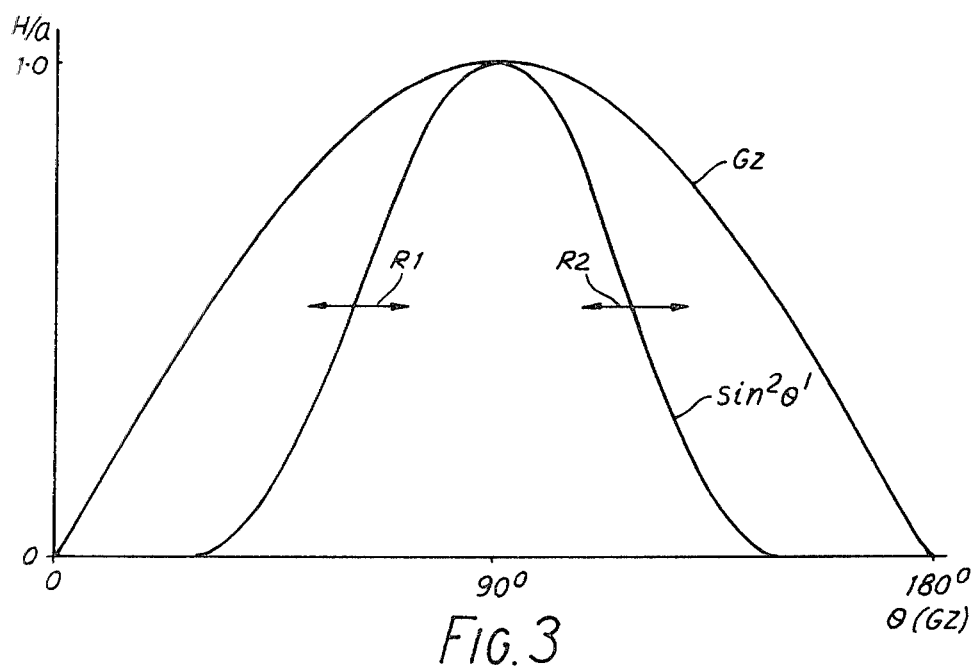
Figure 4:
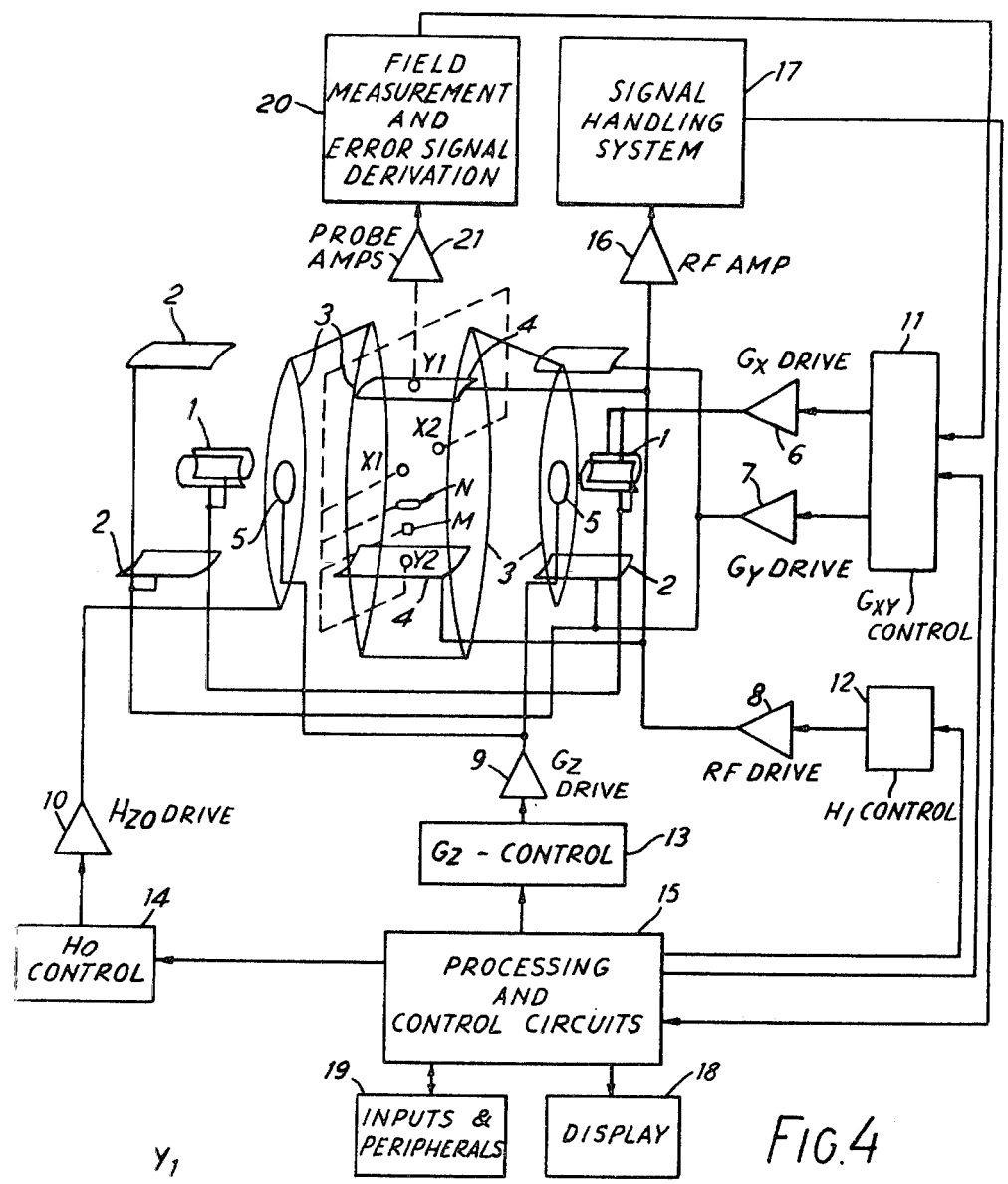
Figure 5:
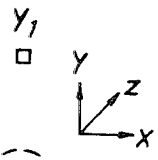
Figure 5:
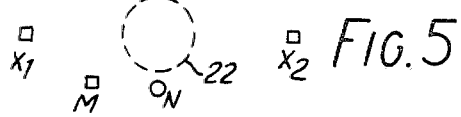
Figure 6:
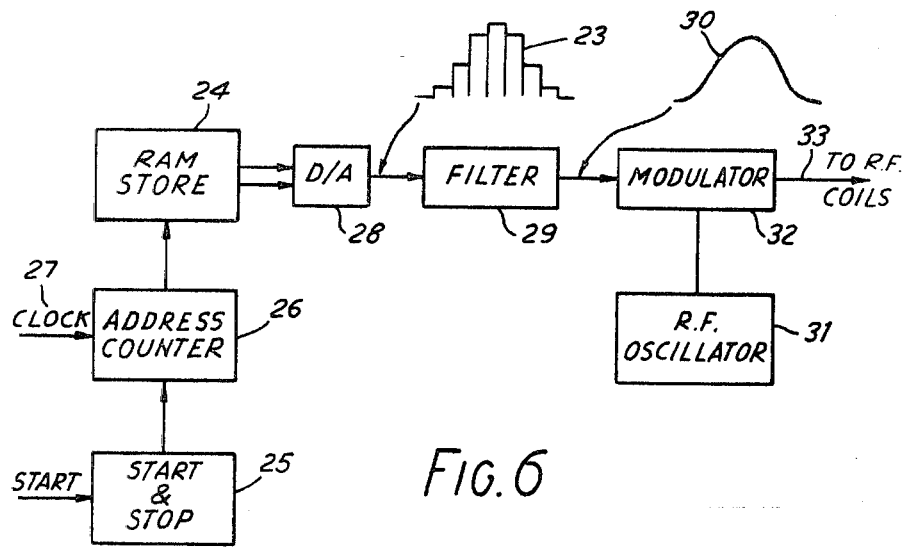
Figure 7:
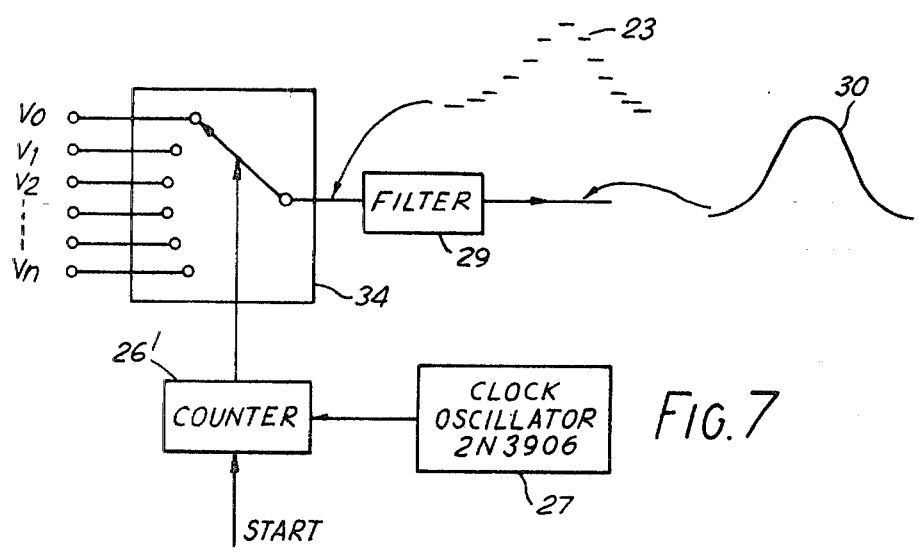
Figure 8:
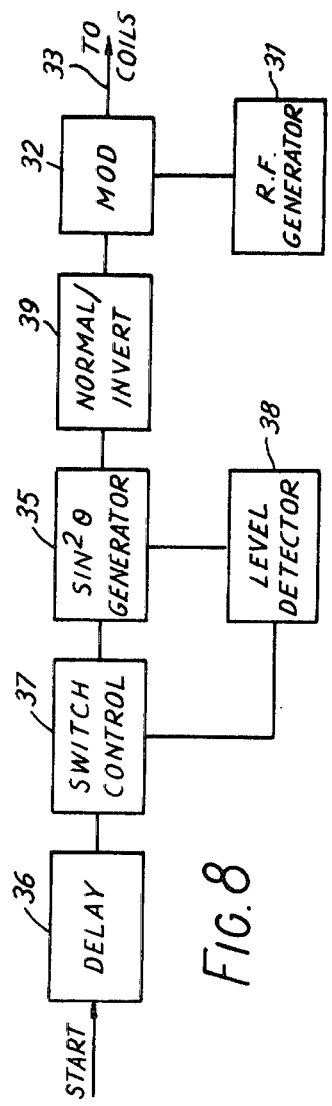
Figure 9:
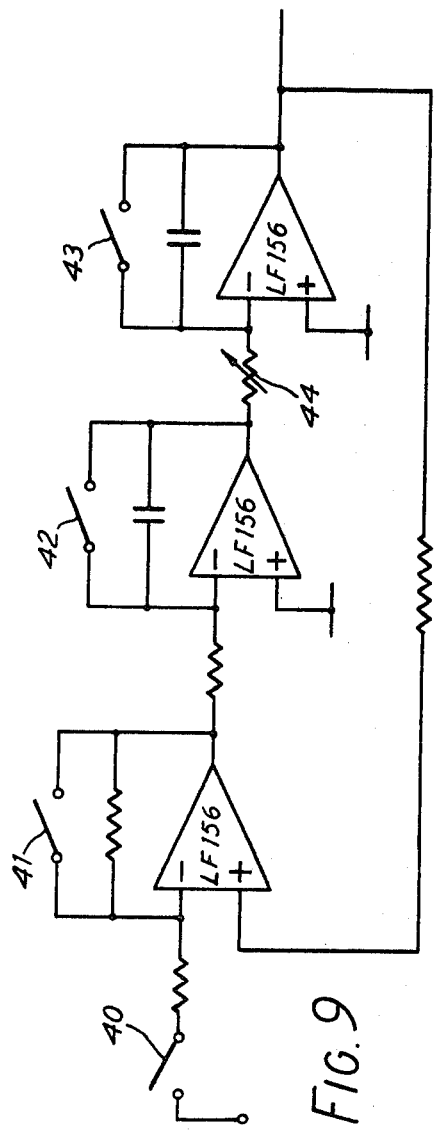

In order that the invention may be clearly understood and readily carried into effect, it will now be described by way of example with reference to the accompanying drawings of which, FIG. 1 shows limits imposed on the $H_1$ pulse by one embodiment of the invention, FIG. 2 shows the result of complying with those limits, FIG. 3 shows limits imposed on the $H_1$ pulse by another embodiment of the invention, FIG. 4 shows, in simplified form, an NMR machine which can include the invention, FIG. 5 shows an arrangement of field sensors for the machine of FIG. 4, FIG. 6 shows a block diagrammatic circuit for providing $H_1$ pulses as required by the invention, FIG. 7 shows an analogue equivalent of part of the circuit of FIG. 6, FIG. 8 shows a block diagrammatic circuit of a different arrangement for producing $H_1$ pulses, FIG. 9 shows pulse shaping circuit for the circuit of FIG. 8, FIG. 10 shows a level detector for the circuit of FIG. 8, and FIG. 11 shows a switching unit for the circuit of FIG. 8.

Nuclear magnetic resonance techniques are generally used to analyse distributions of protons of water molecules in a body. They can, however, be used to analyse other molecules.

Spinning nucleii, subject to a magnetic field, have a resonant frequency related to the value of the field. Then, by application of an RF magnetic field $H_1$ at the resonant frequency, they can be excited and the excitation allowed to decay. The decay causes an induced signal at the resonant frequency in suitable coils around the body.

In the arrangement described in the aforementioned application, the magnetic field is adjusted to have different values in different parts of the body. Only those parts having a resonant frequency, equal to the frequency of the RF field, are excited.

The basic steady magnetic field is in the z direction, usually coaxial with a patient's body and can be called $H_{zo}$ if all fields in that direction are identified as $H_z$. A further, pulsed, $H_z$ component $G_z$ is applied to have a gradient in the z direction so that $Gz = \partial Hz/\partial z$. This provides a unique total field value in a chosen cross-sectional slice of the patient. A periodic (in effect rotating) RF field $H_1$, of frequency chosen to cause resonance in the selected slice, is then applied. Thus substantially only the nuclei (protons) in the slice resonate. The resonance signal from the slice can then be detected. However, as it is detected, there is applied a further pulsed field, $Gr = \partial Hz/\partial r$ which is in the z-direction but has a gradient in a direction r perpendicular to z. This causes frequency dispersion of the resonant frequencies in the r-direction and consequent frequency dispersion of the resonance signal detected. Frequency analysis of this signal, preferably by Fourier Transformation, yields a plurality of resonance signals, each for a different one of a plurality of strips in the chosen slice perpendicular to r.

Now for analysis by the techniques known for X-ray equipment, this procedure is repeated for many different directions of r to provide a plurality of sets of signals for sets of strips in different directions.

In practice, $G_r$ is provided as the sum of $Gx$ ($=\partial Hz/\partial z$) and $Gy$ ($=\partial Hz/\partial y$) gradients were x, y and z are orthogonal directions and the relative magnitudes of the component gradients are varied to change the direction of r.

This invention is concerned with the $H_1$ RF pulse which is applied during the application of the Gz gradient. As mentioned before, resonance should be excited only in the chosen slice. There is a tendency for some resonance to be excited outside the chosen slice. This extraneous excitation results in degradation of the final picture. The slice to be excited is defined by the pulsed Gz gradient which Gz pulse may be applied as a rectangular pulse. For practical reasons, however, it is common to use a substantially sinusoidal pulse for Gz. Typically, it is based on a half cycle of a sine wave of duration 300 $\mu$sec. In that case, extraneous excitation is increased.

It has now been found that excitation outside the chosen slice can be reduced by suitable choice of the $H_1$ pulse (or pulse envelope, bearing in mind that $H_1$ is a burst of RF) shape and duration. Constraints are imposed firstly by a requirement for fast scanning, particularly for medical use, so that the duration of the Gz pulse is a short as possible (300 $\mu$sec. as mentioned). Secondly, therefore a $\pi/2$ $H_1$ pulse envelope must have an integrated area $A = \int H dt$ such that $\gamma A = \pi/2$ where $\gamma$ is the magnetogyric ratio for the nuclear species under examination. For a rectangular pulse of height $H_1$ and duration Tp, this gives $A = H_1 T_p$. Another constraint is that the slice selection be accomplished with the use of a minimum $H_1$ peak. Proposals have been made for the shape of the RF pulse envelope in related nuclear magnetic resonance systems, for example in the paper by J. M. S. Hutchinson, R. J. Sutherland and J. R. Mallard in J. Phys. E: Sci. Instrum. Vol 11, 1978 pp 217-221. That paper discloses an envelope which is described as an apodised sinc $$\left(\frac{\sin x}{x}\right) \text{ function.}$$

It has long been supposed that a sinc function is a theoretically suitable shape for the RF pulse and this version is reduced, especially in the skirts by an exponential component. However it still includes negative going regions. Sinc shaped RF pulses, including the form described in said paper, are suitable for relatively long gradient pulses (of the order of 10 msec). However as mentioned hereinbefore the present invention is concerned with examining living patients in which case fast scanning is required. It is proposed that pulses having negative going regions are not the most suitable for such fast scanning. This invention applies an $H_1$ pulse shape which does not have significant negative going regions and which is especially suitable. If the available duration of $H_1$ is the duration of the Gz pulse, the $H_1$ envelope function can be defined by $H = a \sin^p bt$, where b defines the duration, $b = \pi/(300 \times 10^{-6})$ for a 300 $\mu$sec Gz pulse, and a is chosen to adjust the peak so that the $\pi/2$ area is maintained. If P is integer $P = 0$ gives a square pulse which is completely unsuitable and $P = 1$ gives a sine pulse which is not satisfactory for good pictures. The best results are given for $P = 5$ but results are of suitable quality for $3 \leq P \leq 10$.

FIG. 1 shows the possible pulse shapes for $H_1$. Although the pulses are in practice of different heights so that the area is maintained, in FIG. 1 they are shown as values of H/a so that all pulses appear to be of the same height. The abscissa is the phase of the Gz sine pulse from 0° to 180°. The outer envelope is the Gz sine pulse normalised to the same height. The dashed curve is the $\sin^3 bt$ curve which substantially represents one extreme of acceptable pulse shape, and the dotted chain curve is $\sin^{10} bt$ which is substantially the other extreme. The solid curve is $\sin^5 bt$ which is the preferred curve of these. All of these curves extend between 0° and 180° but in the skirts do not have sufficient amplitude to show in the drawing.

FIG. 2 shows the magnitude of magnetisation $M_{xy}$, produced by these sine curves with distance from the centre of the chosen slice showing the desired centre peak and undesired sidelobes. The curves are identified by values of P. It can be seen that $P = 0$ and $P = 1$ produce excessive sidelobes. It can also be seen that higher values of P produce lower sidelobes but a broader main peak. This is preferable to side lobes but it is one reason why $P = 5$ is preferred and values of $p > 10$ are not considered suitable.

It should be noted that the invention is not limited to the a $\sin^p bt$ curves shown. Referring to FIG. 1, each half of a suitable pulse envelope is a monotonic function lying between the limits represented by the $P = 3$ and $P = 10$ curves.

Suitable curves may be provided by using envelopes which would have excessive width if of the the full Gz duration but with the duration suitably reduced. The skirts of such curves do not therefore, as do those of FIG. 1, extend from 0° to 180°. An example of such a curve is the $\sin^2 \theta'$ curve of FIG. 3, which otherwise corresponds to FIG. 1. This is a $\sin^2 bt$ curve compressed by $90 - \theta' = n (90 - \theta)$ where n is chosen to give the required width (at half height). The curve actually crosses the $\sin^{10} bt$ curve at the skirts of the latter, which extend to 0° and 180°. However it does not change sign and the amplitude of $\sin^{10} bt$ is so low at these points that $\sin^2 \theta'$ can in practice be considered to fall substantially between $\sin^3 bt$ and $\sin^{10} bt$.

Corresponding to the limits of $P = 3$ to 10, the half height of the $H_1$ envelope should occur between 52° and 69° and between 111° and 128° giving a width at half height between 76° and 42°. The corresponding limits for the $\sin^2 \theta'$ curve are $n = 1.20 - 2.14$.

It has been mentioned that the Gz pulse may be a rectangular pulse although it is generally a sine pulse for practical reasons. If the Gz pulse is rectangular, arranging the $H_1$ pulse as explained herein still gives improvement, although the improvement can be gained with a wider $H_1$ pulse. The conditions which would be satisfied can be defined as a unidirectional $H_1$ pulse envelope having rising and falling half heights which each occur within limits of 17% and 32%, of the half height width of the Gz pulse, from the centre of the Gz pulse and on opposite sides of that centre. These limits are shown approximately on FIG. 3, as ranges $R_1$ and $R_2$ for rising and falling half heights respectively. The curve need not be symmetrical provided it does not go significantly negative and its half heights fall in these ranges.

FIG. 4 shows in simplified form an NMR apparatus with which the invention can be used. Illustrated schematically are coils 1; which provide the Gx component of $G_R$; 2, which provide the $G_y$ component of $G_R$; 3, which provide the steady $H_{zo}$ field, 4, which provide the rotating $H_1$ RF field, and 5 which provide the Gz field gradient. The coils are driven by Gx, Gy, RF ($H_1$), Gz and $H_{zo}$ drive amplifiers 6, 7, 8, 9 and 10 respectively, controlled by $G_{xy}(G_R)$, $H_1$, $G_z$ and $H_{zo}$ control circuits 11, 12, 13 and 14 respectively. These circuits can take suitable forms which will be well known to those with experience of NMR equipment and other apparatus using coil induced magnetic fields. The circuits are controlled by a central processing and control unit 15 to achieve a desired pulse sequence.

The signal sensed, during the $G_R$ field application, is detected in the $H_1$ coils 4 and is amplified by an RF amplifier 16 before being applied to signal handling circuits 17. The circuits 17 are arranged to make any appropriate calibrations and corrections but essentially transmit the signals, which are effectively proton density values for strips in the body, to the processing circuits to provide the required representation of the examined slice. These circuits can be specially designed to implement the CT type processing as described and claimed in U.S. application Ser. No. 0,048,777. It is, however, advantageous to implement the processing by a suitably programmed digital computer. This computer can also conveniently control the pulse sequence and thus represents the circuits indicated at 15. The picture thus obtained is viewed on a suitable display 18, such as a television monitor, and this may include inputs and other peripherals 19 for the provision of commands and instructions to the machine, or other forms of output.

The apparatus also includes field measurement and error signal circuits 20 which receive signals via amplifiers 21 from field probes $X_1$, $X_2$, $Y_1$, $Y_2$, N and M shown. The positions of these probes, in relation to the examined slice of the body 22 of the patient, are shown in FIG. 5. $X_1$, $X_2$, $Y_1$ and $Y_2$ are in this example conventional YIG (Yttrium-iron-garnet) tuned oscillator field measuring probes. Those probes give measures of the fields at the points at which they are situated as oscillations with frequency proportional to the field intensity. The values measured are therefore obtained by a count of oscillations in a set time. In practice, the YIG probes can oscillate in different modes and it is necessary to determine the mode in operation. For this purpose there are provided NMR probes M and N. These probes are simply miniature cells of pure water (such as a closed test tube) surrounded by a small coil. They give a reliable resonance of 4.26 $KH_z/Oe$ and can be used to check the YIG tuned oscillator modes. Probe N, fixed in space, acts as a reference. A movable NMR probe M may be moved adjacent the YIG probes in turn to provide data to determine their modes of oscillation, orientation and other characteristics. Alternatively NMR probes may be used in place of the YIG probes exclusively provided the samples therein are sufficiently small, in the direction of the measured field, to give adequate spatial resolution.

The apparatus so far described in relation to FIGS. 4 and 5 is essentially that disclosed in the said co-pending applications. The control circuits 15 control pulses at predetermined times to cause each of the coil control and drive circuits to initiate the required pulses for the examination sequence. This invention proposes that the initiating pulse will be received at $H_1$ control 12, from control 15, at the required time but that $H_1$ control 12 and drive 8 are adapted to provide the $H_1$ pulse envelope described hereinbefore.

Many different arrangements can be adopted to produce the chosen RF envelope. FIG. 6 shows one arrangement for generating the required RF pulse. The description given hereinbefore explains the nature of the pulse envelope and a choice may be made of a particular pulse envelope, within the limits given, as desired. The chosen envelope is divided into a number of discrete intervals, such as shown at 23 in FIG. 6. These are stored as 8-12 bit words in a store 24 which may be a random access memory (RAM) or read only memory (ROM). The start pulse from control 15 is received by start and stop logic unit 25. This may be merely a circuit which appropriately shapes and transmits the start pulse and a clock which initiates a stop pulse a predetermined time later. In one embodiment, unit 25 comprises a light emitting diode which emits light in response to the start pulse and a photo-transistor which receives the light to provide the on-going start signal (OPTO ISOLATOR). The start signal is provided to an address counter 26. This is started by the pulse and is clocked by a clock 27 through prestored addresses of store 24.

Each of the locations of store 24 responds to the addresses to provide in sequence their digital values of the profile and a digital to analogue (D/A) converter 28 converts them to the stepped profile 23. The switching steps are removed by a filter 29 to provide a smooth profile 30. A conventional RF generator 31 provides RF of a suitable frequency for known $H_1$ pulses and this is modulated in a modulator 32 by profile 30 to impose the required envelope on the RF to be provided at 33 to the RF coils. The total number of steps required to be stored at 24 for the profile is not high, 32 being typical.

Although FIG. 6 shows a digital storage of the profile, it should be noted that the stepped profile 23 can be created by analogue means. In the alternative of FIG. 7, the different levels of the stepped profile 23 are provided as voltages $V_1$ to $V_4$ at input ports of an n-pole switch 34. The output of 34 is switched between these voltages by the output of counter 26' and the stepped output provided to filter 29 as in FIG. 6.

In an alternative arrangement discussed hereinbefore, the profile is that of a $sin^2\theta$ pulse but of width less than the period of the Gz pulse.

FIG. 8 shows a block diagram of a circuit for generating such a profile. A $sin^2\theta$ profile is generated by a circuit 35. In order to satisfy the required limits, the profile width is adjusted until it is appropriate and its start is delayed for a predetermined period after the start pulse (GZ start). The required width and delay can be precalculated and a delay circuit 36 is set to delay the start pulse to a switch control 37 which in turn controls generator 35. A level detector 38 determines when the $sin^2\theta$ pulse trailing edge falls to a sufficiently low level and, via control 37, switches off generator 35. A switched inverter circuit 39 allows the profile to be inverted, prior to modulator 32 for purposes when an inverted $H_1$ pulse is required Such circumstances are explained in the aforementioned co-pending applications.

A suitable circuit for a $sin^2\theta$ generator is shown in FIG. 9. The $sin^2\theta$ profile is generated by multiple integration and is initiated in response to the start pulse by control 37 closing switches 40-43 and stopped in response to a pulse from 38 by control 37 opening those switches. Potentiometer 44 controls the width of the pulse. A suitable level detector 38 is shown in FIG. 10.

Switch control circuit 37 can be as shown in FIG. 11. The start pulse from delay 36, via a flip-flop 45 and transistor switch 46 switches on switches 40-43. Flip-flop 45 is reset by an input pulse from level detector 38. It will be understood that switches 40-43, although shown as mechanical switches, are in fact electronic switches.

Other circuits for generating the $H_1$ envelope shape of this invention will be apparent to those with appropriate skills.

Although the embodiment has been described in terms of equipment using a rotating gradient field in the slice with CT type processing, it will be understood that it is applicable to any NMR apparatus selecting resonance in a slice by application of z-gradient and RF pulses.

What we claim is:

1. An apparatus for examining a body by means of nuclear magnetic resonance, the apparatus including: means for applying to the body a steady magnetic field along an axis therein; means for applying a pulsed gradient field which, in conjunction with the steady field, gives a predetermined field in a cross-sectional slice of the body; means for applying a pulsed periodic magnetic field at the Larmor frequency for the field in said slice to cause resonance preferentially therein, the pulse envelope of said periodic field having a rising part and a falling part each of which conforms to a monotonic curve lying substantially between limits defined by a curve defined by amplitude = a $\sin^3 bt$ and by a curve defined by amplitude = a $\sin^{10} bt$, where b defines a duration substantially equal to the gradient field pulse; means for detecting the resonance signal resulting from said resonance; and means for analysing said signal.

2. An apparatus according to claim 1 wherein said monotonic curves lie within said limits except at the skirts thereof.

3. An apparatus according to claim 1 wherein the means for applying the periodic field is arranged so that said envelope is substantially of the shape defined by amplitude = a $\sin^p bt$, for $3 \leq p \leq 10$.

4. An apparatus according to claim 3 wherein the means for applying the periodic field is arranged so that said envelope is of shape amplitude = a $\sin^2 \theta$, where $\theta$ is chosen so that the envelope conforms substantially to the shape amplitude = a $\sin^p bt$ except at the skirts thereof.

5. An apparatus according to claim 3 or claim 4 in which P = 5.

6. An apparatus for examining a body by means of nuclear magnetic resonance, the apparatus including: means for applying to the body a steady magnetic field along an axis therein; means for applying a pulsed gradient field which, in conjunction with the steady field, gives a predetermined field in a cross-sectional slice of the body; means for applying a pulsed periodic magnetic field at the Larmor frequency for the field in said slice to cause resonance preferentially therein; means for detecting the resonance signal resulting from said resonance; and means for analysing said signal; wherein the said periodic field has a pulse envelope of shape lying between extremes defined by amplitude = a $\sin^3 bt$ and amplitude = a $\sin^{10} bt$ where b is set to define the duration and a is set to adjust the peak amplitude to give a desired total field integral for the pulse.

7. An apparatus according to claim 6 in which b is set to give a duration substantially the same as that of the gradient field pulse.

8. An apparatus according to claim 7 in which the amplitude of said envelope is all allowed to fall to zero when the amplitude defined by said limits is below a predetermined proportion of the maximum amplitude.

9. An apparatus for examining a body by means of nuclear magnetic resonance, the apparatus including: means for applying to the body a steady magnetic field along an axis therein; means for applying a pulsed gradient field which, in conjunction with the steady field, gives a predetermined field in a cross-sectional slice of the body; means for applying a pulsed periodic magnetic field at the Larmor frequency for the field in said slice to cause resonance preferentially therein; means for detecting the resonance signal resulting from said resonance; and means for analysing said signal; wherein the said periodic field has a pulse envelope which is of single sign and has rising and falling half heights an opposite sides of the centre of the gradient field pulse and occuring within limits of 17% and 32% of the half height width of the gradient field pulse from said centre.

10. An apparatus according to claim 9 wherein the gradient field pulse is a pulse defined by a half cycle of amplitude of sin o and the rising and falling half heights of the periodic field pulse envelope occur at $52° \leq \theta \leq 69°$ and at $111° \leq \theta \leq 128°$ respectively.

11. An apparatus according to claim 9 wherein the periodic field pulse envelope is the curve $\sin^2 \theta$, where $90 - \theta = n(90 - \theta)$ and $\theta$ is defined such that the gradient pulse extends for $0° \leq \theta \leq 180°$, the value of n being chosen to give a required width at half height.

12. A method of examining a body by nuclear magnetic resonance, the method including: applying to the body a magnetic field including a pulsed field gradient along an axis in the body to provide a predetermined field in a cross-sectional slice perpendicular to said axis; applying a pulsed periodic magnetic field at the Larmor frequency for said predetermined field to preferentially cause resonance in the slice; and sensing the resulting resonance signed for subsequent analysis; wherein the periodic field envelope is a single unidirectional pulse lying substantially inside the curve defined by amplitude = a $\sin^3 bt$, where b defines a direction substantially that of the gradient pulse and a is chosen to give a desired total field integral for the pulse.

13. A method according to claim 12 wherein said envelope lies substantially outside the curve defined by amplitude = a $\sin^{10} bt$.

14. A method of examining a body by nuclear magnetic resonance, the method including; applying the body a magnetic field including a pulsed field gradient along an axis in the body to provide a predetermined field in a cross-sectional slice perpendicular to said axis; applying a pulsed periodic magnetic field the Larmor frequency for said predetermined field to preferfentially cause resonance in the slice; and sensing the resulting resonance signal for subsequent analysis; wherein the periodic field envelope is a single unidirectional pulse having rising and falling half heights within 32% of the half height width of the field gradient pulse from the centre of said gradient pulse.

15. A method according to claim 14 in which the said envelope has rising and falling half heights at least 17% of the half height width of the gradient pulse from the centre thereof.

* * * * *